US011031937B2

(12) United States Patent
Nanaiah et al.

(10) Patent No.: US 11,031,937 B2
(45) Date of Patent: Jun. 8, 2021

(54) DUAL ELECTRO-MECHANICAL OSCILLATOR FOR DYNAMICALLY REPROGRAMMABLE LOGIC GATE

(71) Applicant: King Abdullah University of Science and Technology, Thuwal (SA)

(72) Inventors: Karumbaiah Chappanda Nanaiah, Thuwal (SA); Mohammad Ibrahim Younis, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 58 days.

(21) Appl. No.: 16/606,436

(22) PCT Filed: Apr. 17, 2018

(86) PCT No.: PCT/IB2018/052665
§ 371 (c)(1),
(2) Date: Oct. 18, 2019

(87) PCT Pub. No.: WO2018/193378
PCT Pub. Date: Oct. 25, 2018

(65) Prior Publication Data
US 2021/0111723 A1 Apr. 15, 2021

Related U.S. Application Data

(60) Provisional application No. 62/487,209, filed on Apr. 19, 2017.

(51) Int. Cl.
*H03K 19/21* (2006.01)
*H03K 19/02* (2006.01)

(52) U.S. Cl.
CPC ............ *H03K 19/21* (2013.01); *H03K 19/02* (2013.01)

(58) Field of Classification Search
None
See application file for complete search history.

(56) References Cited

U.S. PATENT DOCUMENTS 8,436,637 B1 5/2013 Ditto et al.
10,536,150 B1 * 1/2020 Granger-Jones .......... B81B 7/02
(Continued)

OTHER PUBLICATIONS

Search Report and Written Opinion for PCT/IB2018/052665 dated Jul. 20, 2018.
(Continued)

*Primary Examiner* — Jany Richardson
(74) *Attorney, Agent, or Firm* — Billion & Armitage

(57) ABSTRACT

Embodiments include a logic gate system comprising a first micro-cantilever beam arranged in parallel to a second micro-cantilever beam in which a length of the first micro-cantilever beam is shorter than a length of the second micro-cantilever beam. The first micro-cantilever beam is adjacent to the second micro-cantilever beam and the first micro-cantilever beam is coupled to an input DC bias voltage source to the logic gate system. The second micro-cantilever beam is coupled to an input AC voltage signal that dynamically sets a logic operation of the logic gate system by at least changing an operating resonance frequency for one or more of the first micro-cantilever beam and the second micro-cantilever beam.

19 Claims, 12 Drawing Sheets

(56) References Cited

U.S. PATENT DOCUMENTS

| | | | | |
|---|---|---|---|---|
| 2009/0256594 | A1* | 10/2009 | Zhu | H01H 1/0094 326/104 |
| 2011/0002168 | A1* | 1/2011 | Schepens | G11C 14/0054 365/185.08 |
| 2014/0062532 | A1* | 3/2014 | Despont | H03K 19/20 326/112 |

OTHER PUBLICATIONS

Hafiz, et al., "Microelectromechanical Reprogrammable Logic Device", Nature Communications/7:11137/ DOI:10.1038/ncomms11137;www.nature.com/naturecommunications, May 29, 2016, 1-9.

Kazmi, et al., "Nanoelectromechanical Resonator for Logic Operations", Proceedings of the 12th IEEE International Conference on Nano/Micro Engineered and Molecular Systems, Apr. 9-12, 2017, Los Angeles, CA, Apr. 9-12, 2017, 11-15.

Mahboob, et al., "Interconnect-free parallel logic circuits in a single mechanical resonator", Nature Communications; 2.198/DOI:10.1038/ncomms1201/www.nature/naturecommunications, Aug. 20, 2010, 1-7.

Bannon, et al., "High-Q HF Microelectromechanical Filters", IEEE Journal of Solid-State Circuits, vol. 35, No. 4, Apr. 2000, pp. 512-526.

Bouchaala, et al., "A Smart Microelectromechanical Sensor and Switch Triggered by Gas", Applied Physics Letters, vol. 109, No. 013502, Jul. 5, 2016, pp. 013502-1-013502-4.

Chen, et al., "Combined Electrical and Mechanical Coupling for Mode-Reconfigurable CMOS-FEMS Filters", 27th International Conference on Micro Electro Mechanical Systems (MEMS 2014), Jan. 26-30, 2014, pp. 1249-1252.

Chen, et al., "Graphene Mechanical Oscillators With Tunable Frequency", Nature Nanotechnology, vol. 8, Nov. 17, 2013, pp. 1-5.

Chowdhury, et al., "Novel Single-Device "XOR" and "AND" Gates for High Speed, Very Low Power LSI Mechanical Processors", 16th International Solid-State Sensors, Actuators and Microsystems Conference, (Transducers'11), Jun. 5-9, 2011, pp. 1100-1103.

Ekinci, et al., "Ultrasensitive Nanoelectromechanical Mass Detection", Applied Physics Letters, vol. 84, No. 22, May 31, 2004, pp. 4469-4471.

Feng, et al., "Low Voltage Nanoelectromechanical Switches Based on Silicon Carbide Nanowires", Nano Letters, vol. 10, 2010, pp. 2891-2896.

Guerra, et al., "A Noise-Assisted Reprogrammable Nanomechanical Logic Gate", Nano Letters, vol. 10, 2010, pp. 1168-1171.

Hafiz, et al., "In-Plane MEMS Shallow Arch Beam for Mechanical Memory", Micromachines,vol. 7, No. 191, Oct. 18, 2016, pp. 1-9.

Hafiz, et al., "Towards Electromechanical Computation: An Alternative Approach to Realize Complex Logic Circuits", Journal of Applied Physics, vol. 120, No. 074501, 2016, pp. 074501-1-074501-10.

Hatanaka, et al., "An Electromechanical Membrane Resonator", Applied Physics Letters, vol. 101, No. 063102, 2012, pp. 063102-1-063102-5.

Ilyas, et al., "An Experimental and Theoretical Investigation of Electrostatically Coupled Cantilever Microbeams", Sensors and Actuators A: Physical, vol. 247, 2016, pp. 368-378.

Ilyas, et al. "Static and Dynamic Amplification Using Strong Mechanical Coupling", Journal of Microelectromechanical Systems, vol. 25, No. 5, Oct. 2016, pp. 916-921.

Ilyas, et al., "Torsion Based Universal MEMS Logic Device", Sensors and Actuators A: Physical, vol. 236, 2015, pp. 150-158.

Jafri, et al., "Nano-Fabrication of Molecular Electronic Junctions by Targeted Modification of Metal-Molecule Bonds", Scientific Reports, vol. 5, Article No. 14431, Sep. 23, 2015, pp. 1-10.

Joachim, et al., "Electronics Using Hybrid-Molecular and Mono-Molecular Devices", Nature, vol. 408, Nov. 30, 2000, pp. 541-548.

Laird et al. "A High Quality Factor Carbon Nanotube Mechanical Resonator at 39 GHz", Nano Letters, vol. 12, 2012, pp. 193-197.

Lee, et al. "Electromechanical Computing at 500'C With Silicon Carbide", Science, vol. 329, Sep. 10, 2010, pp. 1316-1318.

Li, et al. "A Vertically Coupled MEMS Resonator Pair for Oscillator Applications", Journal of Microelectromechanical Systems, vol. 24, No. 3, Jun. 2015, pp. 528-530.

Li, et al., "Mechanically Coupled CMOS-MEMS Free-Free Beam Resonator Arrays With Enhanced Power Handling Capability", IEEE Transactions on Ultrasonics, Ferroelectrics, and Frequency Control, vol. 59, No. 3, Mar. 2012, pp. 346-357.

Li, et al. "Nanoelectromechanical Resonator Arrays for Ultrafast, Gas-Phase Chromatographic Chemical Analysis", Nano Letters, vol. 10, No. 10, 2010, pp. 1-9.

Lin, et al. "Digitally-Specified Micromechanical Displacement Amplifiers", 15th International Conference on Solid-State Sensors & Actuators (Transducers'09), Jun. 21-25, 2009, pp. 781-784.

Mahboob, et al., "Bit Storage and Bit Flip Operations in an Electromechanical Oscillator", Nature Nanotechnology, vol. 3, May 2008, pp. 275-279.

Masmanidis, et al., "Multifunctional Nanomechanical Systems via Tunably Coupled Piezoelectric Actuation", Science, vol. 317, 2007, 4 pages.

Napoli, et al., "Characterization of Electrostatically Coupled Microcantilevers", Journal of Microelectromechanical Systems, vol. 14, No. 2, Apr. 2005, pp. 295-304.

Noh, et al., "A Mechanical Memory With a DC Modulation of Nonlinear Resonance", Applied Physics Letters, vol. 7, No. 033116, 2010, pp. 033116-1-033116-3.

O'Connell, et al., "Quantum Ground State and Single-Phonon Control of a Mechanical Resonator", Nature, vol. 464, Apr. 1, 2010, pp. 697-703.

Pourkamali, et al., "Electrically Coupled MEMS Bandpass Filters Part I: With Coupling Element", Sensors and Actuators A, vol. 122, 2005, pp. 307-316.

Pourkamali, et al., "Electrically Coupled MEMS Bandpass Filters Part II. Without Coupling Element", Sensors and Actuators A, vol. 122, 2005, pp. 317-325.

Roukes, "Nanoelectromechanical Systems Face the Future", Physics World, vol. 14, Feb. 2001, pp. 25-31.

Ruffieux, et al., "Silicon Resonator Based 3.2 µW Real Time Clock With ±10 ppm Frequency Accuracy", IEEE Journal of Solid-state Circuits, vol. 45, No. 1, Jan. 2010, pp. 224-234.

Sazonova, et al., "A Tunable Carbon Nanotube Electromechanical Oscillator", Nature, vol. 431, Sep. 16, 2004, pp. 284-287.

Shalaby, et al., "Design of Spring Coupling for High-Q High-Frequency MEMS Filters for Wireless Applications", IEEE Transactions on Industrial Electronics, vol. 56, No. 4, Apr. 2009, pp. 1022-1030.

Teufel, et al., "Sideband Cooling Micromechanical Motion to the Quantum Ground State", Nature, vol. 475, Jul. 21, 2011, pp. 359-363.

Wanlass, et al., "Nanowatt Logic Using Field-Effect Metal-Oxide Semiconductor Triodes", International Solid State Circuits Conference Digest of Technical Papers Feb. 20, 1963, pp. 32-33.

Wenzler, et al., "A Nanomechanical Fredkin Gate", Nano Letters, vol. 14, Dec. 11, 2013, pp. 89-93.

Yan, et al., "Tunable Dielectric Resonator Bandpass Filter With Embedded MEMS Tuning Elements", IEEE Transactions on Microwave Theory and Techniques, vol. 55, No. 1, Jan. 2007, pp. 154-160.

Yao, et al., "Logic-Memory Device of a Mechanical Resonator", Applied Physics Letters, vol. 105, No. 123104, 2014, pp. 123104-1-123104-4.

Younis, "MEMS Linear and Nonlinear Statics and Dynamics", Springer Science & Business Media, 2011, 463 pages.

* cited by examiner

DUAL ELECTRO-MECHANICAL OSCILLATOR FOR DYNAMICALLY REPROGRAMMABLE LOGIC GATE

TECHNICAL FIELD

The present disclosure is generally related to logic gates and more particularly, to electro-mechanical oscillators that are operable as logic gates.

BACKGROUND

There is an increasing interest in alternative computing architectures due to the limitations of complementary-metal-oxide-semiconductor (CMOS) transistors-based computing, such as their inability to operate at high temperatures and/or ionizing environments and their high off-state power consumption. One alternative approach to overcome these limitations is the use of mechanical computing.

Mechanical computing can be dated back to 1822 when Charles Babbage reported the first mechanical computer called difference engine. However, they were rendered obsolete due to the miniaturization, low power, and fast computing capabilities of transistors. With the advances in device fabrication technologies reaching the nanometer scale, the interest in scalable mechanical computing architectures has been rekindled.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 1b is a diagram showing a cross-section of the electrostatically coupled resonator device of FIG. 1a.

DETAILED DESCRIPTION

The present application describes parallel computing using electrostatically coupled cantilevers, such as micro-cantilever beams, where the device provides the outputs of logic gates. In one embodiment, the electrostatically coupled cantilevers may be configured to operate as two AND gates and an XOR gate logic functions. Using the electrostatically coupled resonant modes of the beams, complex device functions, such as HALF ADDER with reduced electrical interconnects within the device, are realized. Achieving this using transistors would typically require up to 12 electrically interconnected devices.

In other embodiments, the electrostatically coupled cantilevers may be configured to operate as other logic gates, such as AND, NOT, NOR, and, XOR, that may also be dynamically reconfigured from one logic gate function to another by changing a device parameter, such as a drive frequency.

In accordance with embodiments of the present disclosure, the device drive circuit here is relatively simple comprising a two-port configuration, and operates at room temperature with modest vacuum conditions. Also, one of the cantilever beam resonators itself is used as the drive electrode, further increasing the throughput of the device.

In one embodiment, parallel electromechanical computing using electrostatically coupled in-plane micro-cantilever beam resonators operate in the first two resonant modes. The micro-cantilevers, fabricated via optical lithography and surface micromachining, are almost identical except for slight variations in their lengths. The device is driven using two electrical configurations. Using an optimized gate bias voltage and electrical configuration, two AND and an XOR mechanical computing logic gates are demonstrated in an exemplary single device, which upon integration form a HALF ADDER computational circuit, in one embodiment. This significantly reduces the required electrical interconnects and the number of devices (contrary to transistors), thereby providing a promising path towards faster computing elements by increasing the computing functionalities in a single device. In one embodiment, the device is operated at room temperature and modest vacuum conditions of 5 Torr.

Device Fabrication

Figure 1A:
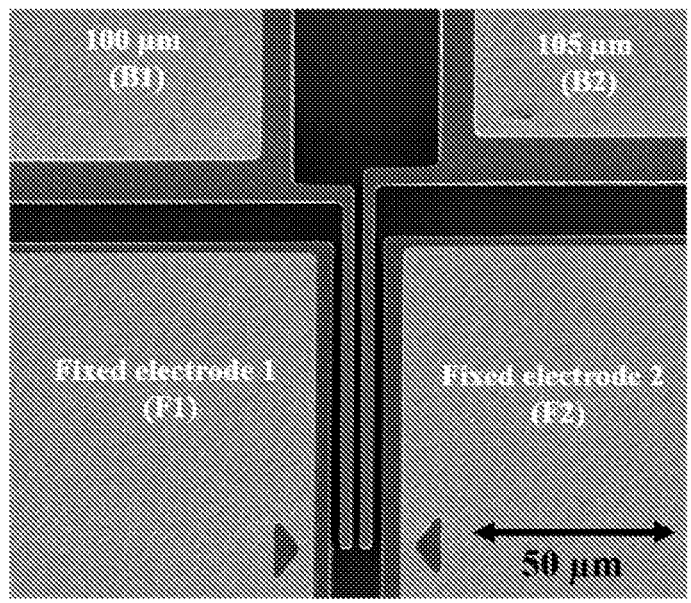
FIG. 1a is a diagram showing a SEM (scanning electron microscope) micrograph of an electrostatically coupled resonator comprising two electrostatically coupled in-plane micro-cantilever beams in accordance with embodiments of the present disclosure.

FIG. 1a shows a SEM (scanning electron microscope) micrograph of the electrostatically coupled resonator comprising two electrostatically coupled in-plane micro-cantilever beams, in one embodiment. The device is fabricated from Si-on-insulator (SOI) wafers using optical lithography and surface micromachining. The device comprises two in-plane parallel micro-cantilever beams that are slightly different in lengths (100 µm and 105 µm) along with two corresponding fixed electrodes (F1 and F2) on either side. In one embodiment, the beams have a thickness of 3 µm, a height of 25 µm, and a gap separating each other by 2 µm.

Figure 1B:
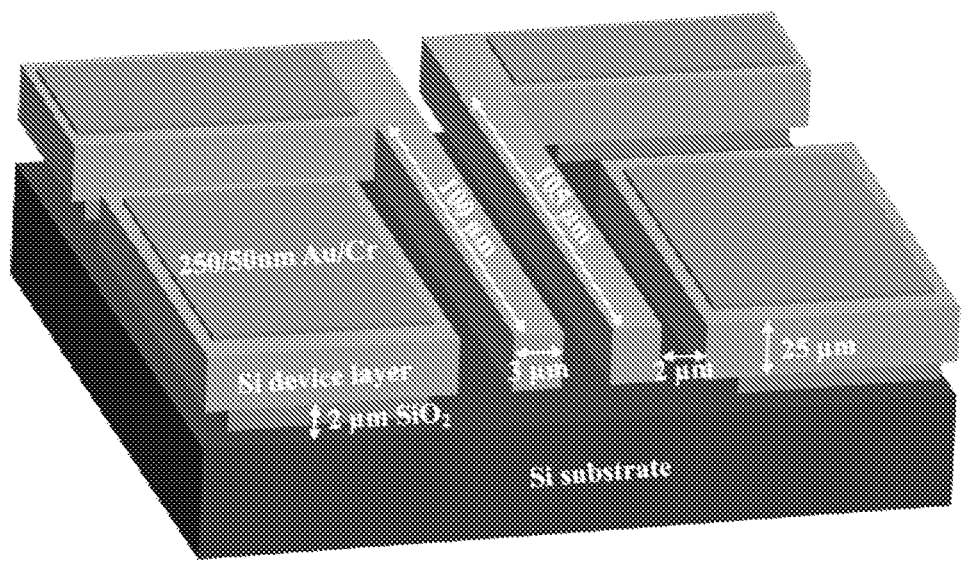

The device may be fabricated from highly doped N-type Si-on-insulator (SOI) wafer with 25 µm device layer and 2 µm buried oxide layer. In one embodiment, 50/250 nm Cr/Au layer is sputter deposited and patterned using optical lithography and liftoff, forming low resistance contacts pads for interfacing the fixed electrodes and the beams. The electrodes and beams may then be defined using standard optical lithography followed by deep-reactive ion etching (DRIE) of Si. The micro-cantilevers can be released to form free standing resonating structures by etching the buried oxide under the beams using HF vapor etch at 40° C. FIG. 1b shows the schematic of a cross-section of the device, in one embodiment.

Electrical Setup

Figure 2A:
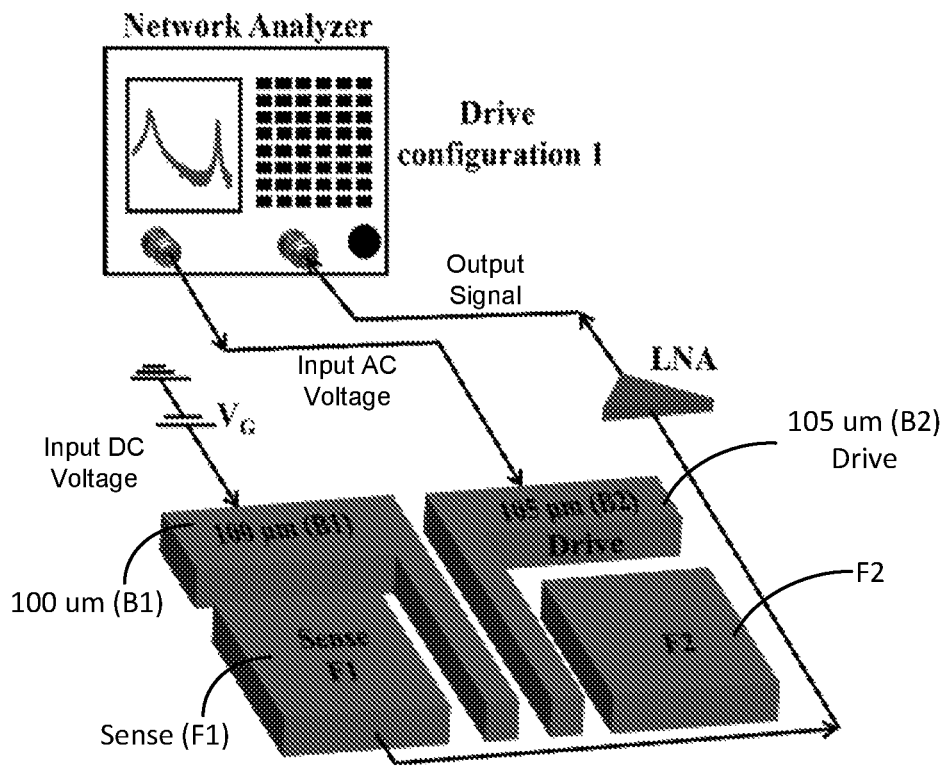
FIGS. 2a and 2b are diagrams showing a comparison of the two drive configurations of the coupled resonator of FIG. 1a with a change in gate bias voltage $V_G$ in accordance with embodiments of the present disclosure.
Figure 2B:
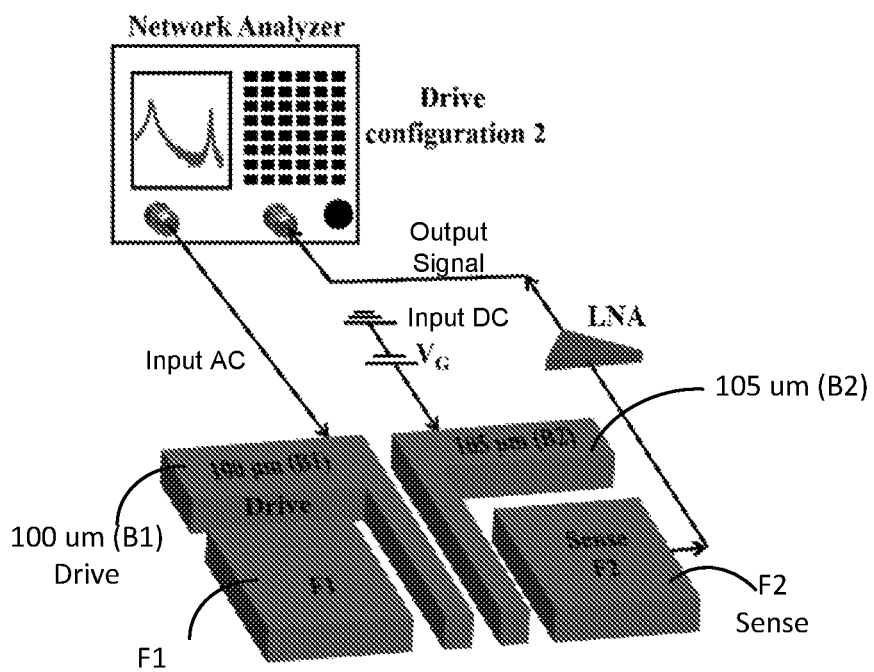

Next, FIGS. 2a and 2b provide schematics of the two electrical drive configurations used for characterizing the mechanical resonators. The drive configurations comprise a two-port drive circuit. An AC (alternating current) frequency sweep is provided using the network analyzer setup measuring $S_{21}$ parameters. The electrical output from a sense electrode is amplified using a low noise amplifier (LNA) before feeding it back to the network analyzer. All the frequency sweep readings are acquired in the forward direction.

In the case of configuration 1, the shorter/stiffer beam (B1) is biased with an input DC bias voltage source (variable gate voltage $V_G$), while the fixed electrode (F1) and the longer/less stiffer beam (B2) are configured as the sense and drive electrodes, respectively. In the case of configuration 2, the longer beam (B2) is biased with gate voltage $V_G$, while the fixed electrode (F2) and the shorter beam (B1) are configured as the sense and drive electrodes, respectively.

The behavior of the device at the two drive configurations with the change in gate voltage bias $V_G$ was studied and the following findings were determined. Irrespective of the drive configurations, applying a gate bias generates an electrostatic force between the two beams. In configuration 1, when the shorter beam is positively biased, the longer beam provides the ground, and in configuration 2 when the longer beam is positively biased, the shorter beam acts as the ground. The device was characterized at 5 Torr vacuum pressure and at room temperature.

Dynamic and Electrical Characterization

Figure 2C:
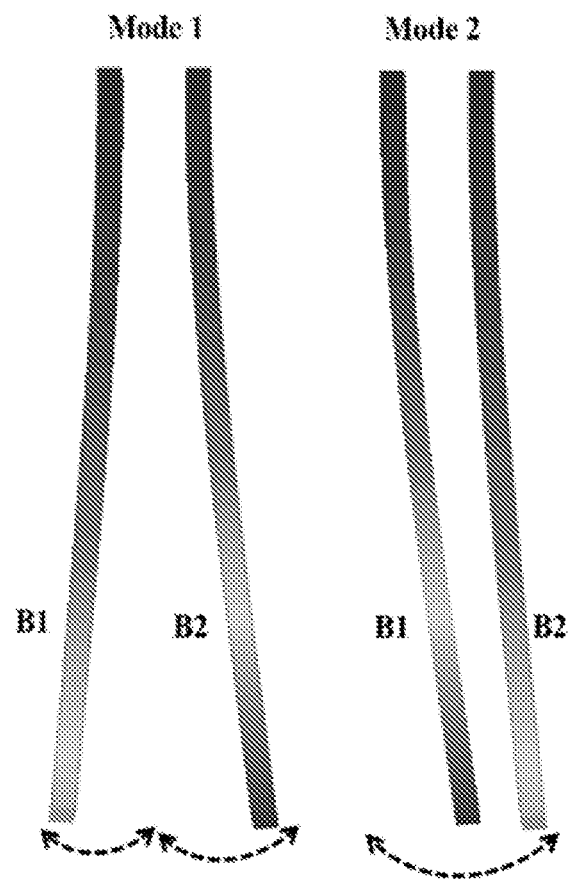
FIG. 2c is a diagram showing two resonant modes realized by the electrostatically coupled resonator of FIG. 1a in accordance with embodiments of the present disclosure.

The device's first two resonant modes are characterized for realizing the electro-mechanical logic gates. In the first resonant mode (M1), the two beams vibrate out of phase whereas in the second resonant mode (M2), the two beams vibrate in phase, as obtained from finite element analysis and shown in FIG. 2c.

FIG. 3 shows a comparison of the change in the electrical response of the coupled resonator for the two drive configurations in configuration 1 (FIG. 2a) and configuration 2 (FIG. 2b), with the change in gate bias voltage $V_G$. Here, an AC voltage load of 70 $mV_{RMS}$ (−10 dBm) is used for all the frequency sweeps.

There are two aspects that define the performance of the first two resonant modes of the device for the two drive configurations. The first aspect is the difference in the stiffness of the beams arising due to the difference in their lengths. This influences the resonance frequencies and their respective amplitudes at the two modes. The second aspect is the difference in the actuation gaps of the beams with respect to the sense electrodes in the two drive configurations. This influences the gain/motional currents of the two modes, where for a lower gap the motional current is higher and vice versa for similar vibrational amplitudes.

In other words, higher vibrational amplitudes do not necessarily yield the same $S_{21}$ gain/motional current in the two drive configurations, since the gain/current depends on the beam's gap from the sense electrode. The combination of these two aspects guide the device's dynamic electrical output. For both drive configurations, the first and the second resonance frequencies of the coupled system are defined by the resonance frequencies of the uncoupled longer beam and the shorter beam, respectively. Therefore in mode 1, the longer beam has higher amplitude (compared to the amplitude of the shorter beam in mode 1), and in mode 2, the shorter beam has higher amplitude (compared to the amplitude of the longer beam in mode 2).

Further, the coupled system in the first mode (mode 1) always vibrates with higher amplitudes compared to the second resonant mode at similar voltages, due to the out of phase vibrations experiencing higher electrostatic force compared to the in phase vibrations. As the gate voltage is increased, the electrostatic coupling increases, which soften the beams and thereby reduces their resonance frequencies and increases the amplitude of vibration. This affects the measured gain/motional current of the two resonant modes of the device at the sense electrode.

Figure 3A:
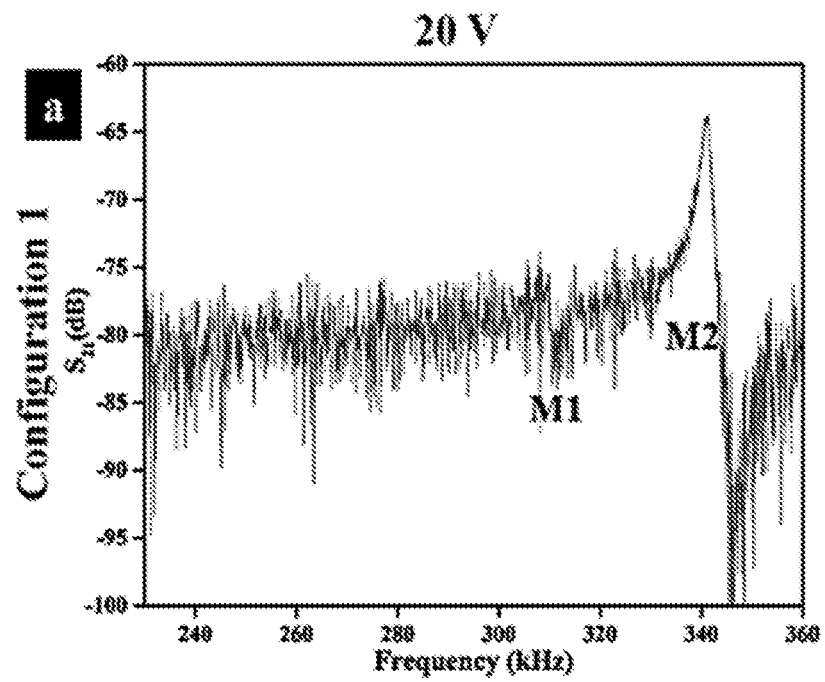
FIGS. 3a-3f are diagrams showing a comparison of electrical responses of the electrostatically coupled resonator of FIG. 1a for the two drive configurations of FIGS. 2a and 2b.
Figure 3B:
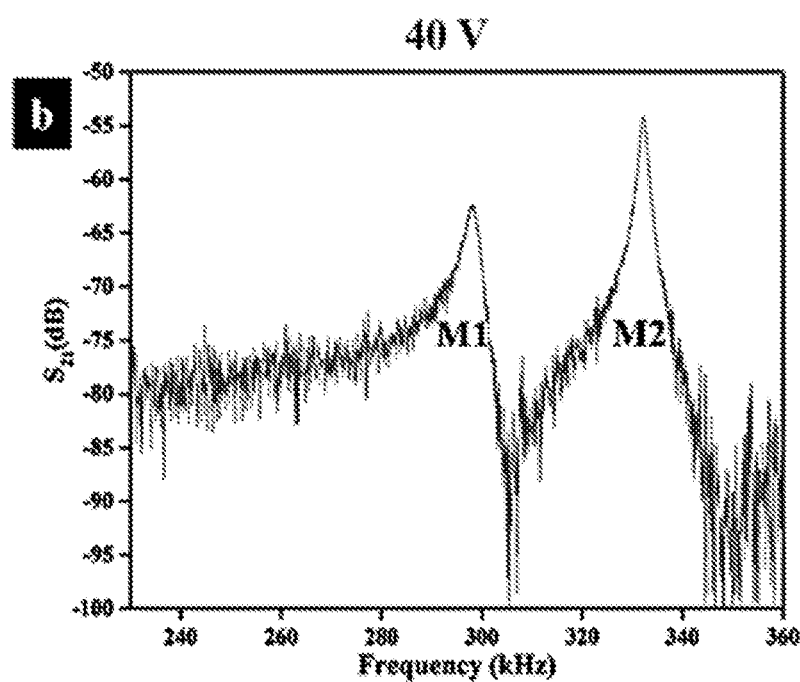
Figure 3C:
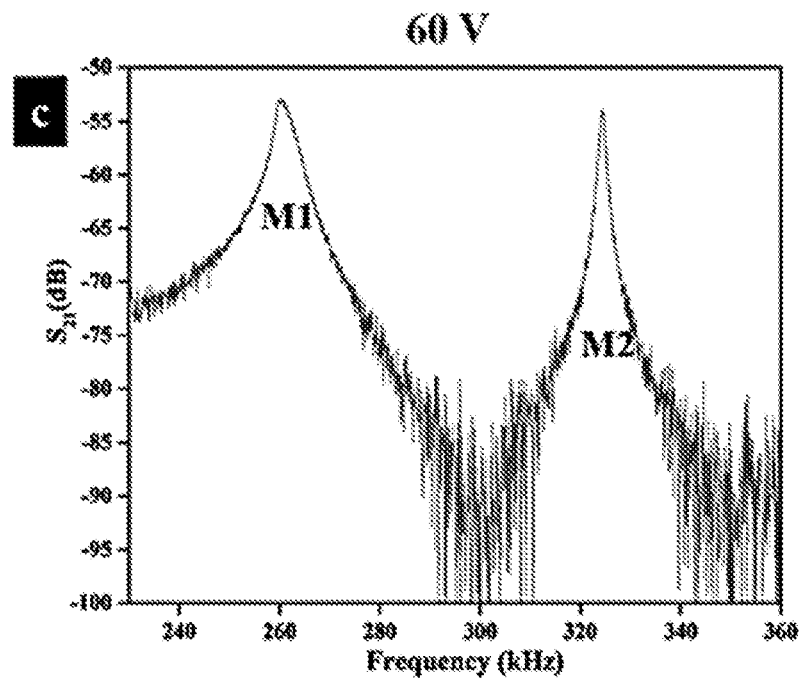
Figure 3D:
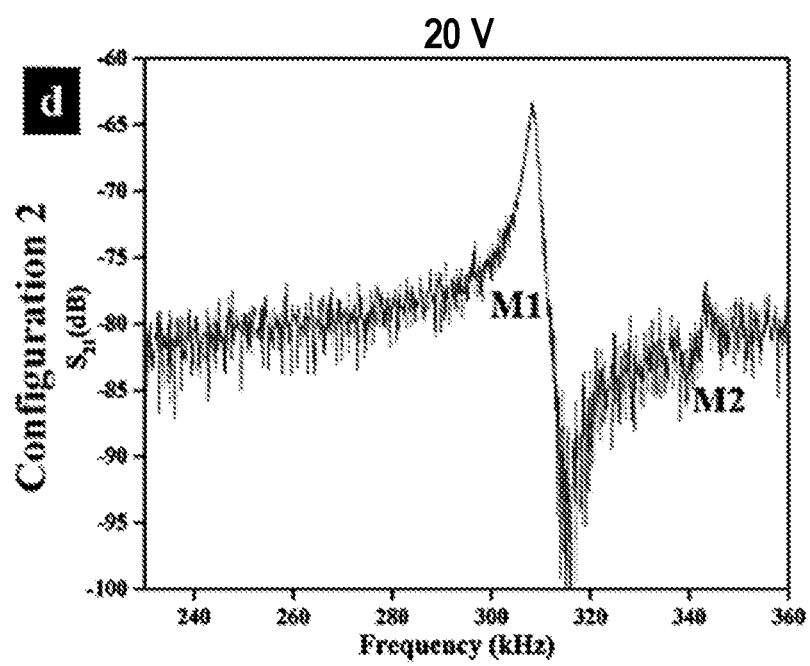
Figure 3E:
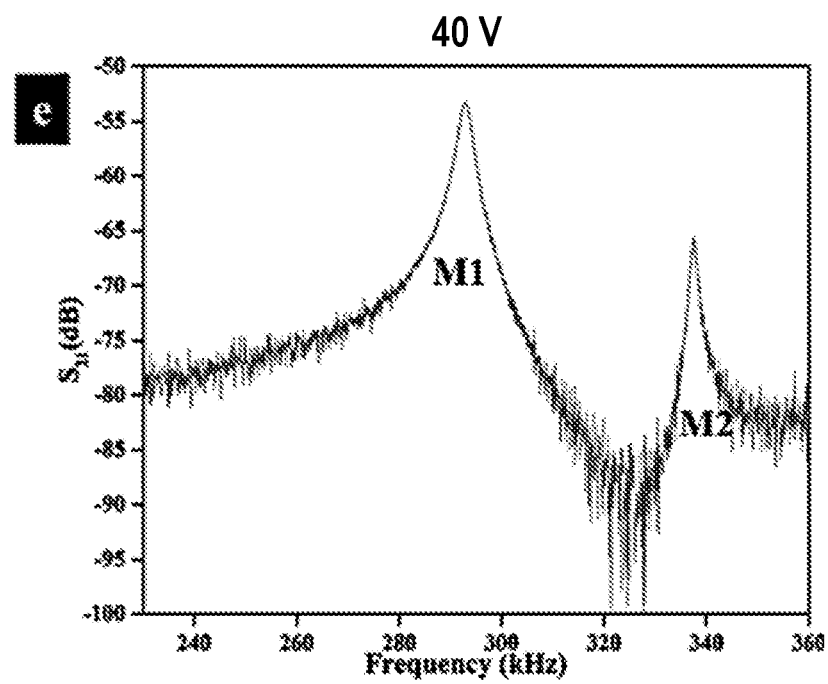
Figure 3F:
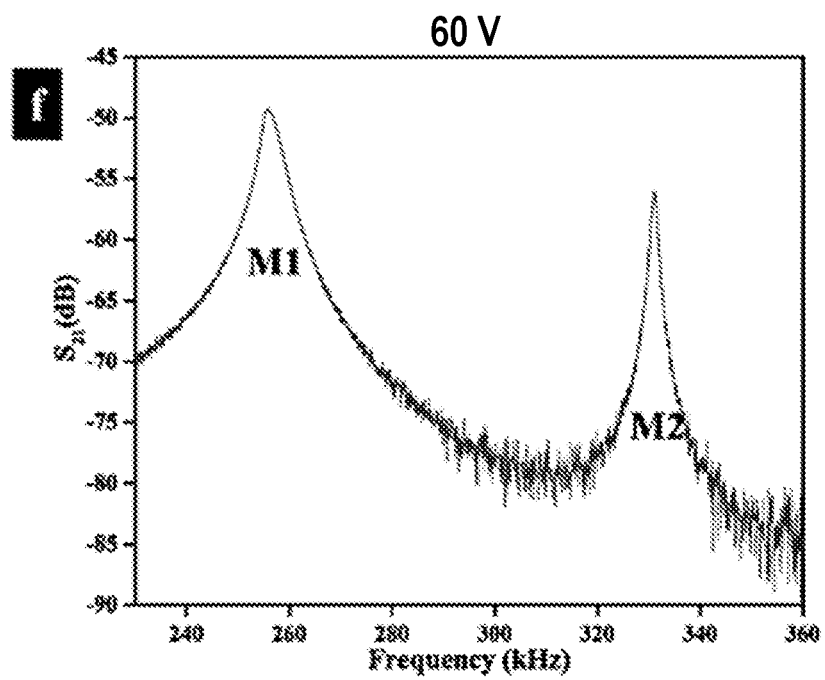

FIGS. 3a-f provide a comparison of the electrical response of the coupled system for the two drive configurations. In particular, FIGS. 3a, 3b, and 3c show the change in the $S_{21}$ response of the coupled micro-cantilevers in drive configuration 1 having two resonant modes M1 and M2, at 20, 40 and 60 V gate DC bias respectively. FIGS. 3d, 3e, and 3f show the $S_{21}$ response of the coupled micro-cantilevers (B1 and B2) in drive configuration 2 at 20, 40 and 60 V gate DC bias respectively.

In FIG. 3a, for drive configuration 1, at low gate voltages (below 20 V), the motional current ($S_{21}$ gain) of mode 1 is negligible and buried in the background electrical signal, whereas the motional current of mode 2 is detectable at 10 V and above. This is because in mode 1, the shorter beam has low amplitude and its motional current/gain is not sufficiently above the back ground electrical signal to be detected even though it is at a shorter distance (2 µm) from the sense electrode F1. The high amplitude of the longer beam is also not detected due to the higher gap (7 µm) from the sense electrode F1. This is in contrary to mode 2, where the shorter beam has higher amplitude and is closer to the sense electrode and therefore its motional current is detected at the sense electrode F1.

In the case of the drive configuration 2, at lower gate voltages (below 20 V), the motional current of mode 2 is negligible and is buried in the background electrical signal (FIG. 3d), whereas the motional current of mode 1 is detectable at 10 V and above (opposite to drive configuration 1 output). This is because the sense electrode F2 is closer to the longer beam detecting its high amplitude in mode 1, whereas the shorter beam's high amplitude in mode 2 is not detected due to larger gap. With the increase in the DC gate bias, the motional current for the two modes increases for both configurations (FIG. 3b, 3c, 3e, 3f) due to the increased electrostatic loading/coupling. The vibrational amplitudes of the longer and shorter beam in mode 1 and mode 2 also increase respectively, leading to an increase in the motional currents, which were otherwise not detected with low electrostatic loading.

The motional currents in the first and second resonant modes at drive configurations 1 and 2 also increase due to the increased amplitudes of the beams B1 and B2, respectively, which are otherwise detected with low electrostatic coupling due to the low gap from their respective sense electrodes F1 and F2. It is worth noting that the shorter beam, in addition to being stiffer, has a lower overlap area with F1 (due to shorter length), which leads to lower vibrational amplitude at resonant modes compared to the longer beam for the same gate bias voltage.

Figure 4A:
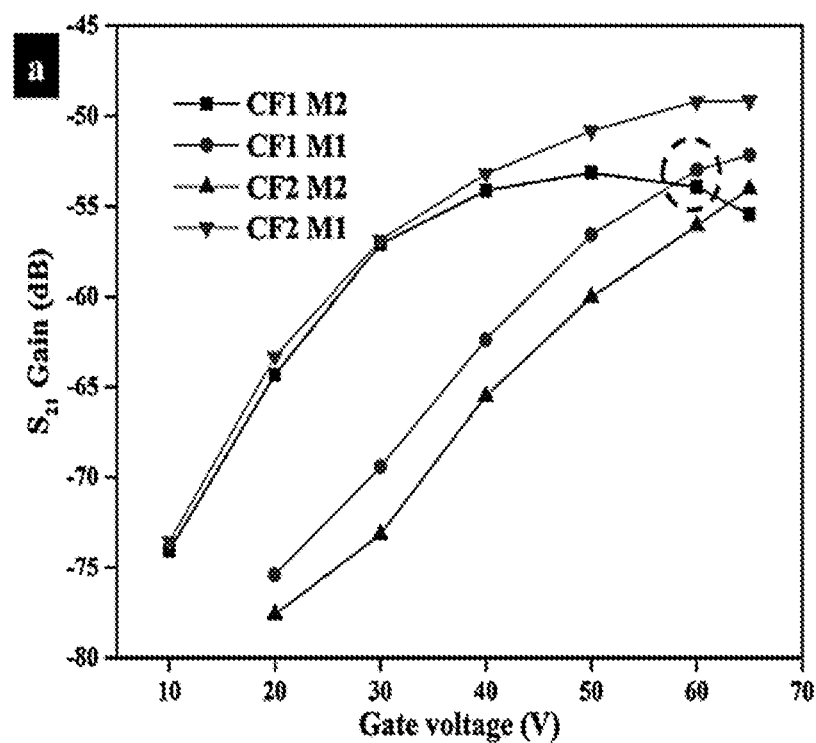
FIGS. 4a and 4b are diagrams showing a comparison of the $S_{21}$ gain and frequency shift of the first two resonant modes of the electrostatically coupled resonator of FIG. 1a with a change in gate bias voltage for the two drive configurations of FIGS. 2a and 2b.
Figure 4B:
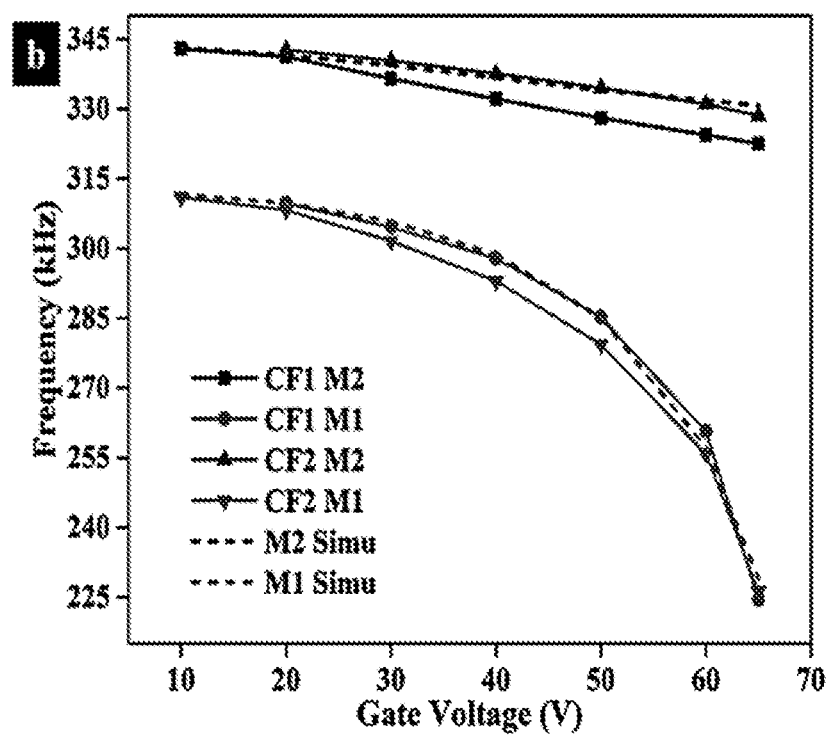

FIGS. 4a and 4b show a comparison of the $S_{21}$ gain and frequency shift of the coupled system's first two resonant modes (M1 and M2) with the change in gate bias voltage for the two drive configurations (CF1 and CF2). The change in $S_{21}$ gain of each resonant mode against the change in gate bias voltage for the two configurations is shown in FIG. 4a. For drive configuration 1, the gain of mode 2 changes nonlinearly from −74 to −53 dB when the gate voltage is changed from 10 to 50 V. Above 50 V, the gain of mode 2 starts to decrease, reaching −55.5 dB at 65 V. However, the gain of mode 1 in drive configuration 1 changes near-linearly from −75.4 to −52 when the gate bias is varied from 20 to 65 V.

In the case of drive configuration 2, the gains of mode 1 and mode 2 change nonlinearly and near-linearly from −63.3 to −49 dB and −77.6 to −54 dB, respectively, with the gate bias varied from 20 to 65 V. Considering drive configuration 1, at around 60 V gate bias (FIG. 4a), the gain of both mode 1 and mode 2 overlap at about −54 dB (highlighted with dotted circle) providing maximum/equal $S_{21}$ gain simultaneously at the two resonance frequencies. This can be used for realizing the parallel resonators based electromechanical computing. However, the gains at the two modes do not equalize in drive configuration 2 because the less stiff (longer) beam is closer to the sense electrode while the stiff (shorter) beam acts as the drive electrode. The DC bias range was limited to 65 V as it was close to the electrostatic pull-in voltage of the resonator.

Next, FIG. 4b shows the change in the resonance frequency of the coupled resonator in the first two resonant modes against the change in the gate bias for the two configurations. As a result, this gate induced frequency shift can be used for switching the device between ON and OFF Boolean states for realizing the electromechanical logic gates. It is observed that mode 2 shows near linear decrease in resonance frequency, whereas mode 1 shows nonlinear decrease in resonance frequency, with the increase in bias voltage for both configurations.

The shift in frequency is due to the electrostatic induced softening of the beams B1 and B2. However, the shift in mode 1 is higher compared to mode 2 due to the difference in the stiffness of the beams as well as the vibrational motion in each mode as explained above. The presence of the non-linear resonance frequency in mode 1 at higher voltages provides further shift in the frequency compared to the linear peaks of mode 2. Ideally, the resonance peaks of two modes at different gate voltages should be the same irrespective of the two drive configurations. Nonetheless, the difference in the shift in frequency of the two resonant modes as seen in FIG. 4b for the two drive configurations may be due to the difference in terms of the length of the beams (resulting in different overlap area) as well as the difference in the dimensions of sense electrode F1 and F2 caused due to fabrication anomalies. Also, the shorter beams have slightly lower electrical resistance and hence affects the electrostatic loading compared to the longer beams, in turn affecting the shift in resonance frequency. However, this difference in the shift of the resonance frequency at the two modes does not impact the device performance for logic gates. The shift in frequency against the change in gate bias is also verified using reduced order model simulations (dashed lines), based on modeling the two beams using an Euler-Bernoulli beam theory (FIG. 4b).

Electro-Mechanical Computation

Figure 5A:
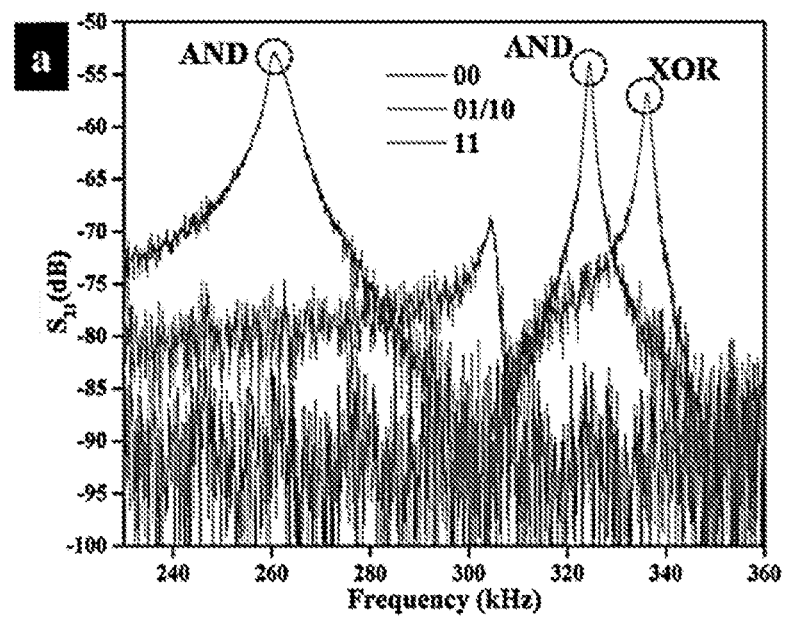
FIGS. 5a-5d are diagrams showing various electrical responses of an exemplary electrostatically coupled resonator operating as mechanical computing device comprising two AND logic gates and an XOR logic gate in accordance with embodiments of the present disclosure.
Figure 5B:
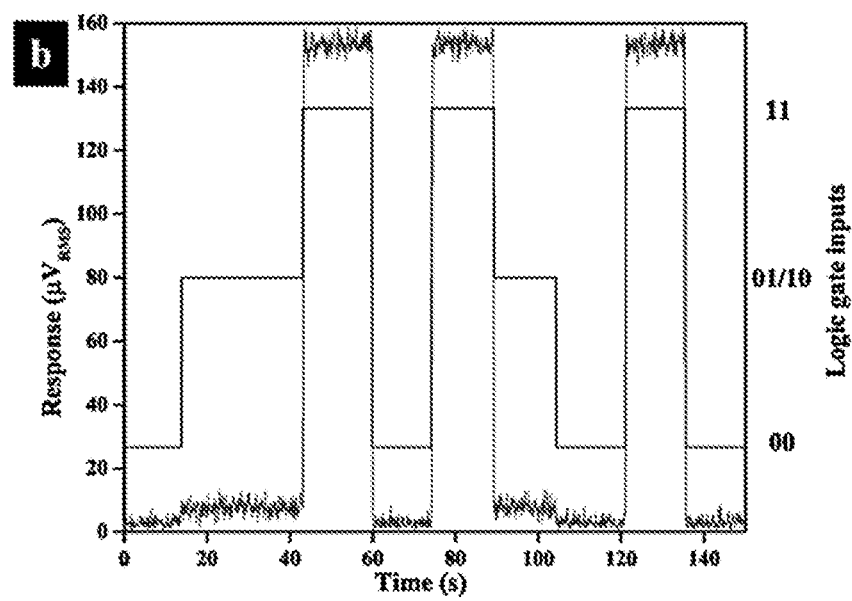
Figure 5C:
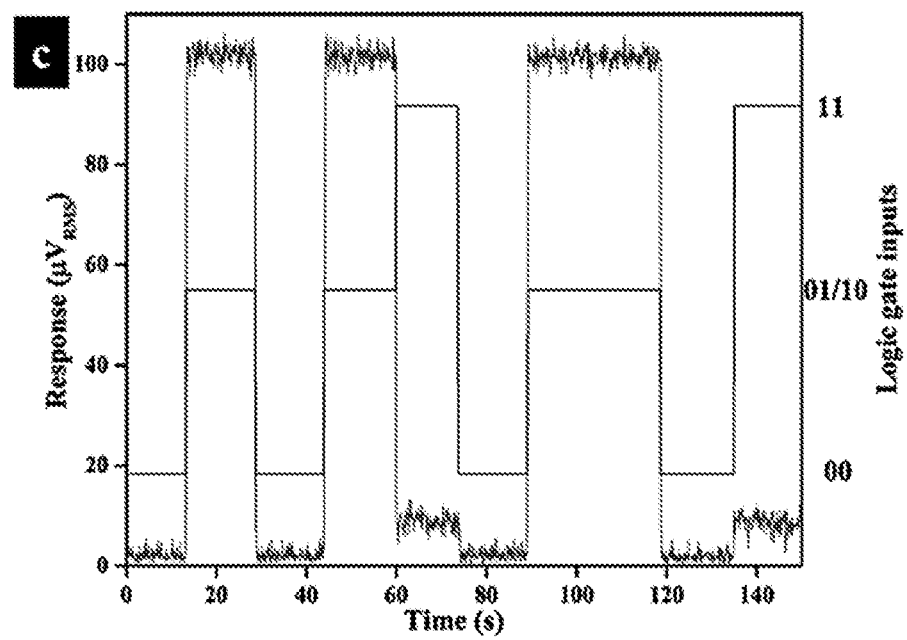

Based on the resonating and non-resonating states of the resonators defined as '1/ON' and 'O/OFF', respectively, and the gate bias induced resonance frequency shift, a parallel computing component capable of operating as two AND gates and an XOR gate is realized. These collectively also form a HALF ADDER circuit in a single device. FIGS. 5a-5d show electrical responses of an exemplary coupled resonator operating as mechanical computing device comprising two AND logic gates and an XOR logic gate, which also provide the CARRY and the SUM bits of a HALF ADDER circuit, respectively. In particular, FIG. 5a depicts a frequency response of the device at 0, 30, and 60 V gate bias. The bandwidths of the device that are suitable for operating as two AND and XOR gates are highlighted with dotted circles in the figure. In FIG. 5b, a plot of the time sweep response of the device as an AND logic gate and CARRY bit operating at 260.4 kHz drive frequency is shown. FIG. 5c displays a plot of the time sweep response of the device as an XOR logic gate and SUM bit operating at 336.3 kHz drive frequency. For FIG. 5d, a reliability of the device showing steady ON state output operating at 260.4 kHz drive frequency equivalent to 3 million switching cycles is illustrated via a time sweep response.

Accordingly, the figures demonstrate the results of the coupled resonators as mechanical computing element. Using the optimized electrical response of the device at drive configuration 1 and 60 V gate bias, the logic gate inputs or input bit signals '0,0', '0,1 or 1,0', and '1,1' are defined as the gate bias voltage at $V_G$=0, 30, and 60 V, respectively. The frequency response of the device at the three voltages is shown in FIG. 5a.

The response of the device at 260.4 kHz (mode 1) and 324.4 kHz (mode 2) is used for realizing the two AND gates, and at 336.3 kHz (mode 2) for XOR logic gate. When the input is 0 V (0,0), the beams do not resonate in either of the modes due to the absence of electrostatic loading, resulting in a '0' logic bit representation output at all the three frequencies. When the input is 30 V (0,1 or 1,0), the device's second mode (mode 2) resonance frequency is at 336.3 kHz giving '1' output, whereas its mode 1 resonance is at 304.5 kHz, which is away from the operating frequencies 324.4 kHz and 260.4 kHz, yielding output '0'. When the input is 60 V (1,1), mode 1 and mode 2 resonate at 260.4 kHz and 324.4 kHz, respectively, yielding '1' output functioning as two AND gates and '0' output at 336.3 kHz functioning as an XOR gate, at the respective frequencies.

The time sweeps of device, shown in FIG. 5b and FIG. 5c at 260.4 and 336.3 kHz, demonstrate the switching operation for different gate inputs functioning as an AND and XOR gates, respectively. When the device is simultaneously driven at either 260.4 (mode 1) or 324.4 (mode 2) kHz and at 336.3 kHz (mode 2), the device is integrated to function as a HALF ADDER, where the SUM bit is provided by the XOR gate (at 336.3 kHz) and the CARRY bit by the AND gate (at 260.4 kHz or 324.4 kHz). However, due to the limitations of the network analyzer to provide a single frequency at a time, the SUM and the CARRY bit functions are demonstrated separately. Note the output at 304.5 kHz for '0, 1' or '1, 0' is not considered for realizing the second XOR gate due to its relatively low electrical response. However, with the optimized device dimensions, it may be possible for the device to function as a dual AND, XOR and HALF ADDER computational circuit. Another factor to consider is the reliability of the device.

Figure 5D:
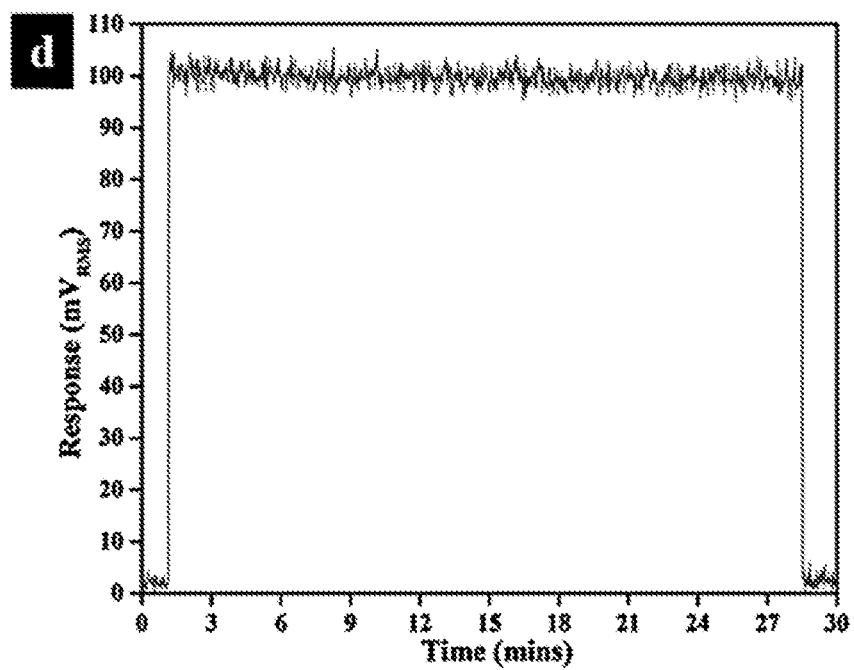

To demonstrate this, the device is operated at 336.3 kHz for about 30 minutes as shown in FIG. 5d. Here, the device shows stable '1' and '0' states without any drift. Considering the switching speed of the device to be about 0.6 ms (explained in the paragraph below), a sweep over 30 minutes is equal up to 3 million switching cycles. When the same device was analyzed for static pull-in behaviors, the switching cycles were limited to few cycles, providing the high reliability and long lifetime in case of dynamic mechanical logic gates.

The operating speed of the device is limited by the mechanical transition time required to switch between non-resonating and resonating states, which is given by Q/f, where Q is the quality factor and f is the resonance frequency. In drive configuration 1, modes 1 and 2 have a quality factor of 145 and 150, respectively. However, the device operation is limited by the slowest beam which is defined by higher quality factor and lower frequency. Considering the quality factor of both the beams to be 150 and operating resonance frequency to be 260 kHz, the switching speed of the device is 0.57 ms per logic operation. Further, the maximum energy required to operate the device is given by $E=0.5CV_G^2 \approx 4 \times 10^{-7}$ J, where C is the capacitance $\approx 10^{-14}$ F and $V_G$ is the gate bias voltage (60 V). The maximum power of the device is 0.4 µW during '1' state and 5 nW during '0' state, which is given by $V_D I_O$, where $V_D$ is the drive frequency amplitude (RMS) and $I_O$ is the output current before amplification. Considering a similar device is fabricated using single walled carbon nanotubes with resonance frequency of 39 GHz, quality factor of 100 and operating at 1V, the switching speed would be 2.5 ns and energy of $10^{-18}$ J. Such a device could be comparable with the current state of art transistors, with added advantage of realizing full computational operation in a single device as well as its ability to perform in harsh environments.

As discussed, in an exemplary embodiment of the present disclosure, two nearly identical electrostatically coupled identical micro-cantilever beam resonators have two resonant modes, where in the first mode (mode 1), the two beams vibrate out of phase and in the second mode (mode 2), they vibrate in phase, and two drive configurations where when one of the beam acts as the drive electrode, the other beam is biased with the gate voltage and vice versa. Equal $S_{21}$ gains in the two resonant modes are attained when the shorter beam is biased with the optimized gate voltage and configured closer to the sense electrode while the longer beam acts as the drive electrode. Using the optimized response of the coupled device, the present disclosure has demonstrated two AND gates, an XOR gate, and a HALF ADDER electro-mechanical computing element within the same device. In one embodiment, the device has 0.57 ms of switching speed demonstrated at room temperature and 5 Torr pressure. Such a device provides a promising path towards scalable mechanical computational architectures as an alternative to traditional transistors with enhanced computing capabilities.

Additionally, other logic gates may be demonstrated using electrostatically coupled in-plane micro-cantilever beams by changing the operating drive frequency. In various embodiments, the lengths of the respective cantilever beams may also be modified and are not limited to the specific examples disclosed herein. In the discussions that follow, a 2-bit XOR, 2- and 3-bit AND, 2- and 3-bit NOR, and 1-bit NOT mechanical-logic-gates are demonstrated in a single device, which require reduced energy per logic operation (lower than 20%), number of electrical interconnects and number of devices (per logic operation). In one embodiment, the device is able to dynamically reconfigure between logic gates in real time without the need for any change in the drive circuit. This demonstration paves a promising path towards low energy mechanical computing architectures with enhanced functionality.

Figure 6:
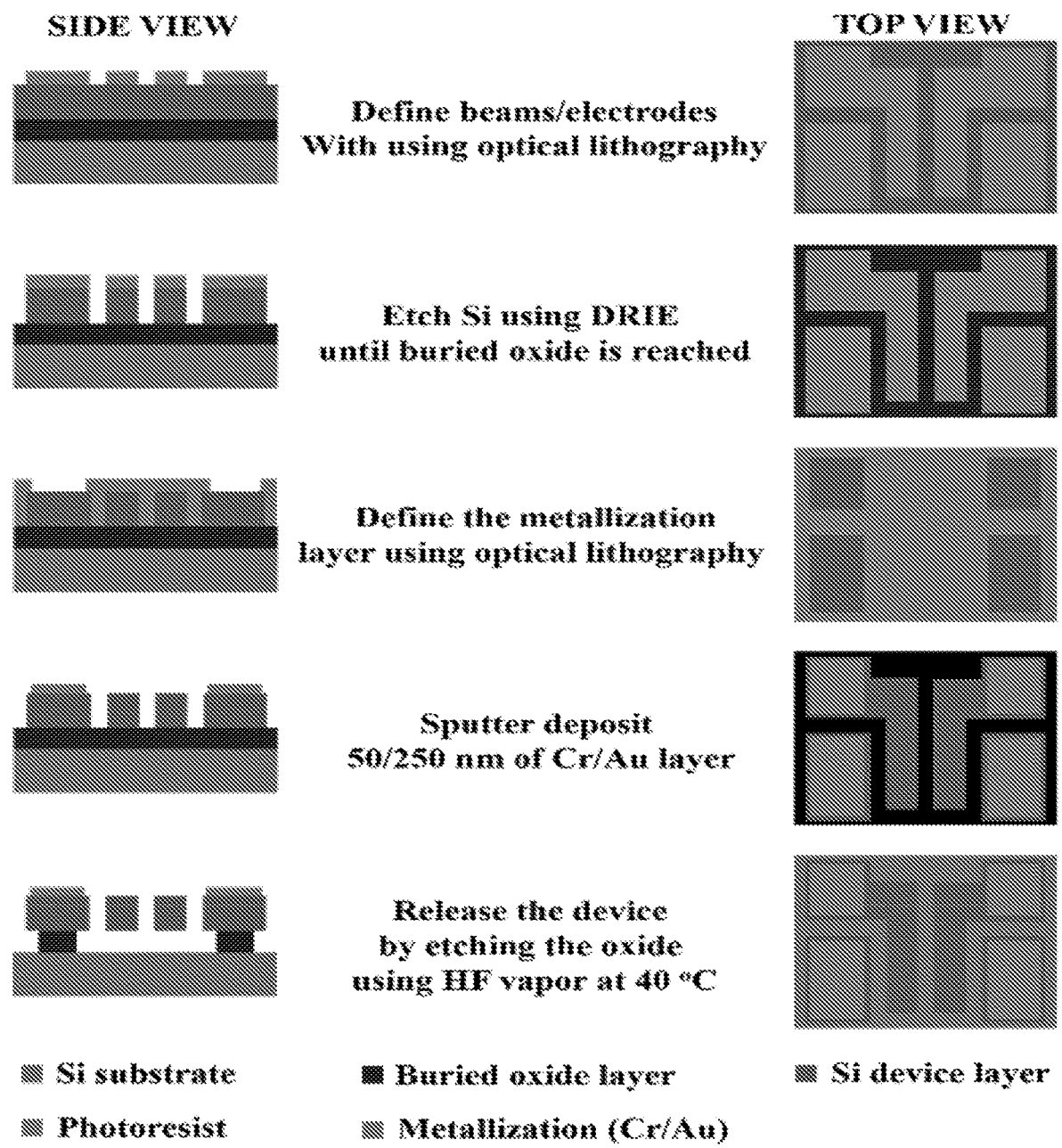
FIG. 6 is a schematic diagram of the fabrication steps for an embodiment of in-plane Si micro-cantilever beams of an electrostatically coupled resonator device in accordance with embodiments of the present disclosure.

Accordingly, the present disclosure demonstrates an electrostatically coupled micro-cantilevers system that operates in non-contact mode, has multiple Boolean gate functionality integrated in single device, can be dynamically changed between logic gates in real time, and requires less than 20% of energy per logic operation in comparison to the uncoupled system. In one embodiment, the device comprises two in-plane Si micro-cantilevers, slightly different in lengths (100 and 105 µm), fabricated from Silicon-on-insulator (SOI) wafer using standard optical lithography and surface micromachining. A schematic of the fabrication steps for an embodiment of the in-plane Si micro-cantilever beams is shown in FIG. 6, in which the micro-cantilevers may be fabricated from SOI wafers via optical lithography and surface micromachining (deep reactive ion etching {DRIE} and hydrofluoric acid vapor etch). Similar to previous discussions, the mechanical motion in the cantilevers is induced by electrically actuating using a standard two-port network analyzer drive circuit, which provides an AC voltage ($V_{AC}$) sweep in the forward direction.

Figure 7A:
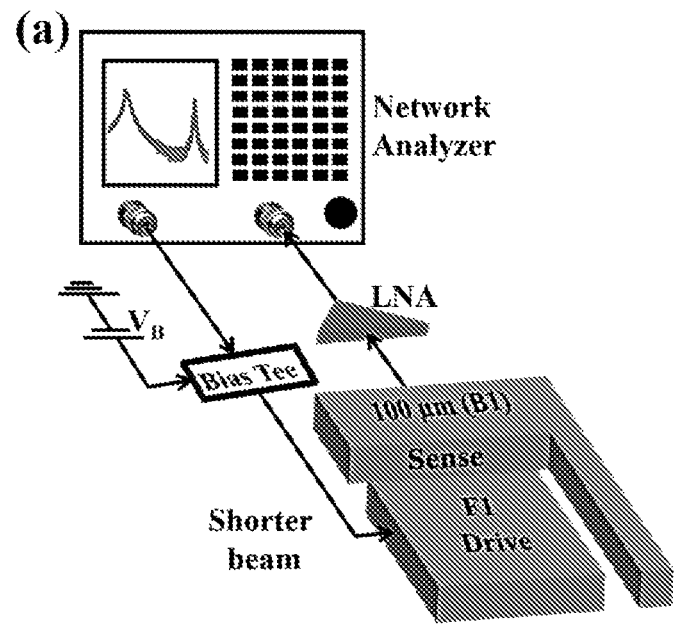
FIGS. 7a and 7b are diagrams showing exemplary drive circuits to actuate the beams independent of each in the electrostatically coupled resonator device of FIG. 6 in accordance with embodiments of the present disclosure.
Figure 7B:
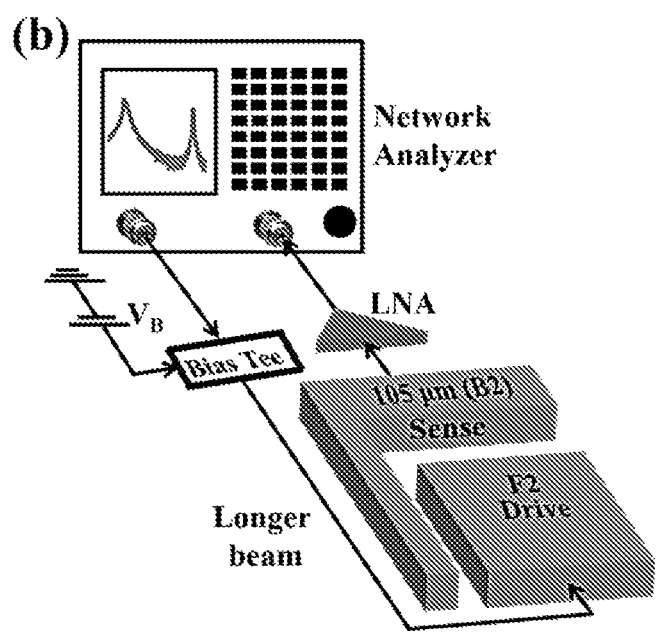

FIGS. 7a and 7b show exemplary drive circuits to actuate the beams independent of each other. In FIG. 7a, the shorter beam is actuated by configuring the fixed electrode (F1) as the drive electrode and the shorter beam as the sense electrode. Additionally, the DC bias is interfaced through a bias tee circuit. In FIG. 7b, the longer beam is actuated by configuring fixed electrode (F2) as the drive electrode and the longer beam as the sense electrode.

Figure 7C:
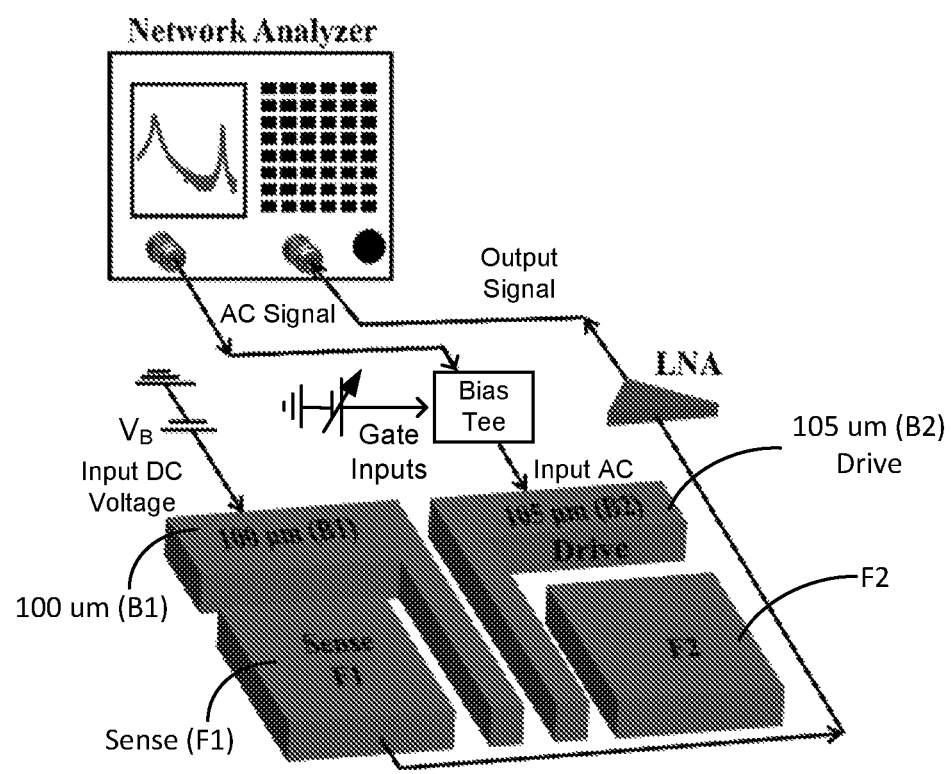
FIG. 7c is a diagram showing an exemplary drive circuit to actuate the coupled parallel micro-cantilever beams for an embodiment of the electrostatically coupled resonator device in accordance with embodiments of the present disclosure.

Thus, in one embodiment, as shown in FIG. 7c, the shorter beam (B1) is biased with an input DC bias voltage (DC voltage $V_B$), while the longer beam (B2) and the fixed electrode (F1) are configured as the drive and sense electrodes, respectively. As such, the bias voltage $V_B$ electrostatically couples the two electrodes resulting in two resonant modes, where in mode 1 the beams resonate out of phase and in mode 2 the beams resonate in phase, as previously represented in FIG. 2c. In one embodiment, the device has the two resonant modes at 275.34 and 328.96 kHz, with 55 V $V_B$ and 70.7 m$V_{RMS}$ $V_{AC}$.

Shift in the resonance frequencies of the coupled (FIG. 7c) and uncoupled systems (FIGS. 7a and 7b) may be compared with respect to the change in the voltage $V_B$, where the uncoupled system corresponds to the resonance frequency of the two cantilevers actuating independent of each. With the change in $V_B$ from 20 to 60 V, mode 1, mode 2, longer beam and shorter beams, have a shift in resonance by 56.9, 16.5, 16.9, and 14.8 kHz, respectively.

Mode 1 demonstrates about 335% larger shift in resonance frequency when compared to the corresponding uncoupled longer beam. This larger shift in resonance frequency is due to the reduced pull-in voltages, where the beams when coupled has 30.3% lower pull-in voltage when compared to the uncoupled longer beam. This enhances the voltage induced spring softening in the coupled system, causing larger shift in the resonance frequencies of mode 1. Harvesting the larger shift in the resonance frequency of mode 1, mechanical-Boolean-logic-gates with reduced energy costs may be realized.

In one embodiment, a variable DC bias gate signal representing three DC bias gate inputs ($I_1$, $I_2$, $I_3$) oppose the bias voltage $V_B$ and are interfaced to the drive electrode of the circuit using the bias tee (FIG. 7c). They provide the gate inputs required for realizing the 1-, 2- and 3-bit logic gates. The circuit is configured such that, when $I_1$ is ON (=5 V), it represents "1" input for 1-bit logic gate, "0, 1" or "1, 0" inputs for 2-bit logic gates, and "0, 0, 1", "0, 1, 0" or "1, 0, 0" inputs for 3-bit logic gates. It is to be noted that "1" is used to represent ON Boolean state and "0" for OFF Boolean state.

When $I_2$ is ON (=10 V), it represents "1, 1" inputs for 2-bit logic gates and "0, 1, 1", "1, 0, 1" or "1, 1, 0" inputs for 3-bit logic gates. $I_3$ is used only to realize 3-bit logic gates, and when ON (=15 V), represents "1, 1, 1" inputs. The gate inputs $I_1$, $I_2$, and $I_3$ are configured such that, only one of the inputs is switched ON at a time. When all the gate inputs are OFF, they represent "0", "0, 0" or "0, 0, 0" inputs for 1-, 2- or 3-bit logic gates, respectively.

During testing of the frequency response of the coupled system for the gate inputs $I_1$, $I_2$, and $I_3$, the bias voltage $V_B$ and an AC signal having voltage $V_{AC}$ are fixed at 55 V and 70.7 $V_{RMS}$, respectively. When all the logic gate inputs are OFF, the mode 1 resonance frequency is at 275.34 kHz due to the 55 V from $V_B$. This is used as the operating frequency for realizing 1-bit NOT, 2-bit and 3-bit NOR logic gates. When $I_1$ is ON, the mode 1 resonance frequency is increased to 287.3 kHz. This is used as the operating frequency for realizing a 2-bit XOR gate, in one embodiment. This increase in resonance frequency is due to the reduction of effective DC bias in the coupled system to 50 V (reduced by $I_1$ which is opposite to $V_B$), and in turn affecting the spring stiffness of the system. Similarly during testing, when 12 or 13 is ON, the mode 1 resonance frequency further increases to 297.1 or 302.72 kHz, respectively. This shift is again due to the reduction in the effective bias voltage to 45 and 40 V, and its effect on the spring stiffness. 297.1 and 302.72 kHz are used as the operating frequencies for realizing 2- and 3-bit AND logic gates, respectively, in one embodiment.

During testing of mode 1 time responses of the coupled system operating as a dynamically reconfigurable mechanical-logic-gates, the $V_B$ and $V_{AC}$ voltages are fixed at 55 V and 70.7 $mV_{RMS}$, respectively. The device is dynamically reconfigured from one logic gate function to another by simply changing the drive frequency. The resonating and the non-resonating states of device are assigned as ON/1 and OFF/0 logic output states.

A 1-bit NOT gate is realized when the device drive frequency is programmed to be 275.34 kHz. The device output is "1" due to $V_B$ even though there is no bias from the gate input. When the gate input is "1" (provided by tuning ON only 11), the mode 1 resonance frequency increases to 287.3 kHz (as explained above), changing the device to a non-resonating state at 275.34 kHz. This provides the outputs states of a NOT gate.

At the same frequency, a 2-bit NOR is realized using gate inputs $I_1$ and $I_2$. When the inputs are "0, 0", the output is "1", due to the $V_B$. When the input is "0, 1" or "1, 0" (provided by tuning ON only 11), the output is switched to "0" as the resonating state is shifted to 287.3 kHz. When the input is "1, 1" (provided by tuning ON only 12), the output is again "0" as the resonating state is further shifted to 297.1 kHz. This provides the logic output states required of a 2-bit NOR gate.

Further, a 3-bit NOR gate can also be realized at the 275.34 kHz using gate inputs $I_1$, $I_2$, and $I_3$. Similar to working principle of the 2-bit NOR gate, except for "0, 0, 0" gate inputs, the output of the device is always "0", acting as a 3-bit NOR gate. The inputs "1, 1, 1" are provided by turning only 13 ON. At "1, 1, 1" inputs, the resonance frequency of mode 1 is further shifted to 302.72 kHz. Using this approach, up to 21-bit NOR logic gates can be realized, because, as the collective gate input voltages in increased (maximum up to 105 V), the mode 1 resonance frequency is always shifted to frequencies away from the operating point.

The system is dynamically changed to a 2-bit XOR gate by changing the operating drive frequency to 287.3 kHz. When the inputs are "0, 0", the mode 1 resonance frequency is at 275.34 kHz, yielding a non-resonating "0" output state at 287.3 kHz. When the inputs are "0, 1" or "1, 0", the mode 1 resonance frequency matches with the operating frequency, switching to output "1". When the inputs are "1, 1", the resonance frequency is shifted to 297.1 kHz, switching back to output "0" at 287.3 kHz. This configuration provides the output states required of a 2-bit XOR gate.

A 2-bit AND gate is realized by programming the drive frequency to be 297.1 kHz. When the inputs are "0, 0", the output is "0" as the mode 1 resonance frequency is at 275.34 kHz, away from operating frequency 297.1 kHz. When the inputs are "0, 1" or "1, 0", the frequency is shifted to 287.3 kHz, which is still away from 297.1 kHz, resulting in output "0". When the inputs are "1, 1", the mode 1 resonance frequency matches the operating frequency resulting in output is "1". This provides the required output states for realizing a 2-bit AND gate. Similarly, a 3-bit AND gate is realized by programming the operating drive frequency to be 302.72 kHz. The output state is "0" except when the inputs are "1, 1, 1". This is because, only when the inputs are "1, 1, 1", mode 1 resonance frequency matches with the drive frequency yielding output "1", forming a 3-bit AND gate.

In the coupled system configuration, 5 V is used for defining a logic gate input "1", such that there is sufficient shift in the mode 1 resonant bandwidth and the device output can switch between the "0" and "1" states. The gate input DC value is chosen such that, it induces sufficient change in the spring stiffness, which is the key parameter required for realizing the logic gates.

Considering the NOT logic gate configuration, when a 5 V ("1") gate is provided, the mode 1 resonance frequency is shifted by about 11.96 kHz (sufficient to switch between output states). To achieve a similar shift in the resonance frequency of the uncoupled longer beam, it would require a DC bias greater than 25 V for defining the gate input. This demonstrates that the electrostatic coupling technique requires less than 20% of DC bias for defining the gate input. The energy cost required by the device to perform one logic operation is given by $E=CV_BV_I$ where C is the capacitance $\sim 10^{-14}$ F (assuming a parallel plate), $V_B$ is the bias voltage (55 V) and $V_I$ is the gate input voltage (5 V). The energy required by the coupled system is $\sim 3\times 10^{-12}$ J, whereas that of the uncoupled longer beam is 5 times higher $\sim 1.5\times 10^{-11}$ J. The maximum power of the device is $\sim 8$ nW during the ON state and $\sim 1$ nW during OFF state, defined by $V_{AC}I_O$, where $V_{AC}$ is the alternating drive input amplitude (RMS) and $I_O$ is the output current before amplification.

Another important factor affecting the device performance is the switching speed, which is governed by time required for the mechanical transition between non-resonating and resonating states. This is estimated by Q/f, where Q is the quality factor and f is the operating frequency. At operating the frequency of 275.34 kHz (slowest operating frequency), the mode 1 quality factor is about 140, yielding to switching speeds of 0.5 ms.

The development of a dynamically reconfigurable logic device in a single device with reduced gate input voltages and device energy enhances the potential for realizing low powered mechanical computing architectures. The structures can be further exploited to develop low powered mechanical memory for integrating with the computing elements. Though the device demonstrated here is in the micro-scale range, scaling down such a device using 1D materials such as graphene and carbon nanotubes to the nanometer regime, could potentially lead to ultra-low power and faster mechanical computing elements which are comparable to the present transistors, along with added advantage of tunability.

It should be emphasized that the above-described embodiments of the present disclosure are merely possible examples of implementations, merely set forth for a clear understanding of the principles of the disclosure. Many variations and modifications may be made to the above-described embodiment(s) without departing substantially from the principles of the disclosure. All such modifications and variations are intended to be included herein within the scope of this disclosure and protected by the following claims.

Therefore, at least the following is claimed:

1. A logic gate system comprising:
a first micro-cantilever beam arranged in parallel to a second micro-cantilever beam, wherein a length of the first micro-cantilever beam is different than a length of the second micro-cantilever beam, wherein the first micro-cantilever beam is adjacent to the second micro-cantilever beam,
wherein the first micro-cantilever beam is coupled to an input DC bias voltage source to the logic gate system, and the second micro-cantilever beam is coupled to an input AC voltage signal that dynamically sets a logic operation of the logic gate system by at least changing an operating resonance frequency for one or more of the first micro-cantilever beam and the second micro-cantilever beam.

2. The logic gate system of claim 1, wherein the logic operation of the logic gate system is configurable to operate as either a first AND logic gate at a first operating frequency of the input AC voltage signal, a second AND logic gate at a second operating frequency of the input AC voltage signal, or an XOR logic gate at a third operating frequency of the input AC voltage signal.

3. The system of claim 2, wherein the XOR logic gate and the first AND logic gate or the second AND logic gate collectively operate as a HALF ADDER circuit.

4. The system of claim 1, wherein resonating state of at least one of the first and second micro-cantilever beams represents a logic ON/1 output, and wherein a non-resonating state of at least one of the first and second micro-cantilever beams represents a logic OFF/0 output.

5. The logic gate system of claim 1, wherein the second micro-cantilever beam is coupled to a DC gate bias signal, and wherein the DC gate bias signal is adjustable to represent an input value of the logic gate system.

6. The system of claim 1, wherein the logic operation of the logic gate system is selectively operable as each of a 1-bit NOT logic gate, a 2-bit NOR logic gate, a 3-bit NOR logic gate, a 2-bit XOR logic gate, a 2-bit AND logic gate, and a 3-bit AND logic gate as selected by tuning an operating frequency of the input AC voltage signal to a designated frequency corresponding to a particular logic gate.

7. A method of implementing a logic gate system, comprising:
providing a first micro-cantilever beam arranged in parallel with a second micro-cantilever beam, wherein a length of the first micro-cantilever beam is different than a length of the second micro-cantilever beam and wherein the first micro-cantilever beam is adjacent to the second micro-cantilever beam;
connecting the first micro-cantilever beam to an input DC bias voltage source for the logic gate system;
connecting the second micro-cantilever beam to an input AC voltage signal;
dynamically setting a logic operation of the logic gate system by at least changing an operating resonance frequency for the first micro-cantilever beam or the second micro-cantilever beam or both;
inputting an input bit signal to the logic gate system; and
obtaining an output bit representation for the logic gate system from a first fixed electrode.

8. The method of claim 7, further comprising:
configuring the logic operation of the logic gate system to operate as either a first AND logic gate at a first operating frequency of the input AC voltage signal, a second AND logic gate at a second operating frequency of the input AC voltage signal, or an XOR logic gate at a third operating frequency of the input AC voltage signal, wherein the input DC bias voltage represents an input bit signal to the logic gate system.

9. The method of claim 8, wherein the XOR logic gate and the first AND logic gate or the second AND logic gate collectively operate as a HALF ADDER circuit.

10. The method of claim 7, wherein a resonating state of at least one of the first and second micro-cantilever beams represents a logic ON/1 output, and wherein a non-resonating state of at least one of the first and second micro-cantilever beams represents a logic OFF/0 output.

11. The method of claim 7, wherein the second micro-cantilever beam is coupled to a DC gate bias signal, and wherein the DC gate bias signal is adjustable to represent an input value of the logic gate system.

12. The method of claim 7, wherein the logic operation of the logic gate system is configured to operate as each of a 1-bit NOT logic gate, a 2-bit NOR logic gate, a 3-bit NOR logic gate, a 2-bit XOR logic gate, a 2-bit AND logic gate, and a 3-bit AND logic gate as selected by tuning an operating frequency of the input AC voltage signal to a designated frequency corresponding to a particular logic gate.

13. A method of operating a logic gate, comprising:
applying a DC-bias voltage to a first micro-cantilever;
applying an AC voltage signal to a second micro-cantilever arranged in parallel and adjacent to the first cantilever, wherein a frequency of the AC voltage signal sets a logic operation of the logic gate, wherein applying the AC voltage signal with a first frequency to the second micro-cantilever causes the logic gate to operate according to a first logic operation, and wherein applying the AC voltage signal with a second frequency different than the first frequency causes the logic gate to operate according to a second logic operation different than the first logic operation;
applying a gate DC-bias voltage to the second micro-cantilever, wherein the gate DC-bias signal represents a logic input to the logic gate; and
determining, based on whether at least one of the first and second micro-cantilevers vibrate at a resonant frequency in response to the frequency of the AC voltage signal and the gate DC-bias voltage, an output of the logic gate.

14. The method of claim 13, wherein applying the gate DC-bias voltage to the second micro-cantilever comprises:

applying a first discrete DC voltage level to represent a first input value; and applying a second discrete DC voltage to represent a second input value different than the first input value.

15. The method of claim 13, wherein the first micro-cantilever is shorter than the second micro-cantilever.

16. The method of claim 13, wherein the second micro-cantilever is shorter than the first micro-cantilever.

17. The method of claim 13, further comprising:

configuring, based on a frequency of the AC voltage signal, the logic operation of the logic gate system to operate as either a first AND logic gate at a first operating frequency of the AC voltage signal, a second AND logic gate at a second operating frequency of the AC voltage signal, or an XOR logic gate at a third operating frequency of the AC voltage signal, wherein the gate DC bias voltage represents an input bit signal to the logic gate system.

18. The method of claim 13, further comprising:

configuring the logic operation of the logic gate system to operate as each of a 1-bit NOT logic gate, a 2-bit NOR logic gate, a 3-bit NOR logic gate, a 2-bit XOR logic gate, a 2-bit AND logic gate, and a 3-bit AND logic gate by tuning the frequency of the AC voltage signal to a designated frequency corresponding to a particular logic gate.

19. The method of claim 13, further comprising:

using the determined output of the logic gate as part of a mechanical computer.

\* \* \* \* \*